(12) United States Patent
Beekman et al.

(10) Patent No.: US 6,905,962 B2
(45) Date of Patent: Jun. 14, 2005

(54) METHOD OF DEPOSITING A LAYER

(75) Inventors: Knut Beekman, Yatton (GB); Paul Rich, Gloucestershire (GB); Claire Louise Wiggins, Cheltenham (GB)

(73) Assignee: Trikon Technologies Limited, Gwent (GB)

( * ) Notice: Subject to any disclaimer, the term of this patent is extended or adjusted under 35 U.S.C. 154(b) by 0 days.

(21) Appl. No.: 10/654,404

(22) Filed: Sep. 4, 2003

(65) Prior Publication Data

US 2004/0058529 A1 Mar. 25, 2004

Related U.S. Application Data

(62) Division of application No. 09/548,014, filed on Apr. 12, 2000, now Pat. No. 6,831,010.

(30) Foreign Application Priority Data

Apr. 20, 1999 (GB) .............................................. 9908882

(51) Int. Cl.$^7$ ................................................. H01L 21/44
(52) U.S. Cl. ........................ 438/677; 438/685; 438/688
(58) Field of Search ................................ 438/677, 685, 438/688, 906, 507, 618, 630, 640, 642, 650, 656

(56) References Cited

U.S. PATENT DOCUMENTS

| | | | |
|---|---|---|---|
| 4,957,604 A | 9/1990 | Steininger | |
| 4,959,136 A | 9/1990 | Hatwar | |
| 5,204,192 A | 4/1993 | Nakamura et al. | |
| 5,242,860 A | 9/1993 | Nulman et al. | |
| 5,278,448 A | 1/1994 | Fujii | |
| 5,462,890 A | 10/1995 | Hwang et al. | |
| 5,523,259 A | 6/1996 | Merchant et al. | |
| 5,591,663 A | 1/1997 | Nasu et al. | |
| 5,795,823 A | 8/1998 | Avanzino et al. | |
| 5,843,843 A | 12/1998 | Lee et al. | |
| 5,851,917 A | 12/1998 | Lee | |
| H1792 H | 4/1999 | Moran et al. | |
| 5,899,720 A | 5/1999 | Mikagi | |
| 6,001,736 A | 12/1999 | Kondo et al. | |
| 6,025,762 A | 2/2000 | Roy et al. | |
| 6,077,571 A | 6/2000 | Kaloyeros et al. | |
| 6,143,128 A | 11/2000 | Ameen et al. | |

FOREIGN PATENT DOCUMENTS

| | | |
|---|---|---|
| EP | 0 327 888 A2 | 8/1989 |
| EP | 0 583 736 A1 | 2/1994 |
| GB | 2 266 897 A | 11/1993 |
| JP | 7142412 | 6/1995 |
| JP | 8274076 | 10/1996 |
| JP | 9246212 A | 9/1997 |
| JP | 11040518 | 2/1999 |
| WO | WO 88/02033 | 3/1998 |

OTHER PUBLICATIONS

C.R. Aita, "Basal orientation aluminum nitride grown . . . ", J. Appl. Phys. 53(3), Mar. 1982, pp. 1807–1808.

Hwan–Chul Lee et al., "Effects of sputtering pressure and nitrogen concentration on the preferred orientation of AlN thin films," Journal of Material Science: Materials in Electronics (1994) 221–225.

Hiroshi Okano et al., "Preparation of C–Axis Oriented AlN Thin Films by Low–Temperature Reactive Sputtering," Jpn. J. Appl. Phys. vol. 31 (1992), Pt. 1, No. 10, pp. 3446–3451.

*Primary Examiner*—George Fourson
*Assistant Examiner*—Fernando L. Toledo
(74) *Attorney, Agent, or Firm*—Volentine Francos & Whitt, PLLC

(57) ABSTRACT

This invention relates to a method of depositing a layer on an exposed surface of an insulating layer of material. The method includes treating the exposed surface with hydrogen or a gaseous source of hydrogen in the presence of a plasma, prior to or during deposition of a metallic layer.

10 Claims, No Drawings

METHOD OF DEPOSITING A LAYER

This is a divisional of and claims priority to U.S. patent application Ser. No. 09/548,014, filed Apr. 12, 2000, now U.S. Pat. No. 6,831,010, the entire contents of which are incorporated herein by reference.

This invention relates to a method of depositing a layer on an exposed surface of an insulating layer of material.

It has been known for some time that the grain structure of a deposited layer can be affected by the structure of the layer on to which it is deposited. This relationship is discussed in terms of aluminium layers deposited on titanium in U.S. Pat. No. 5,523,259 and on titanium nitride layers in U.S. Pat. No. 5,242,860. Perhaps one of the most complete and recent expositions on the state of the art concerning the grain structure of metal conductors on barrier layers and how a preferential grain structure is achieved is contained in WO 99/10921. However, there is no indication in the prior art of the relationship between the structure of metallic deposited layers and insulating layers upon which they lie. Further prior art gives no indication of how such an insulating layer may be treated to improve the deposited layer structure for these purposes.

In addition to bulk interconnects another technology in which this is significant is the formation of acoustic wave devices wherein the orientation of the piezoelectric layer can be significant in the performance of the device.

Thus in a first aspect the invention consists in a method of depositing a metallic layer or layers on the exposed surface of a previously deposited insulating layer upon a substrate including treating the exposed surface with hydrogen or a gaseous source of hydrogen in the presence of a plasma prior to the deposition of the metallic layer or layers.

Surprisingly it has been found that the exposure to hydrogen changes the structure of at least the exposed surface of the insulating layer in a sense to improve the orientation of a metallic layer and in particular a piezo electric layer subsequently deposited upon the substrate. This may be because hydrogen is implanted in the exposed surface or because the hydrogen modifies e.g. by etching the exposed surface or a combination of the two.

It is preferred that the extent of the hydrogen treatment is such that the Full Wave Half Maximum (FWHM) of the rocking curve on a preselected crystallographic plane of a deposited layer is less than 2.5°.

The plasma may be an Inductively Coupled Plasma in which case the substrate may be placed on an RF biased platen, which may be heated. Alternatively the plasma process may be Reactive Ion Etching. In the first case the process time for the hydrogen treatment may be between 35 and 25 minutes, and in the second case the treatment period may be more than 5 minutes and less than 15 minutes.

Typically the substrate will be a semiconductor such as silicon or the insulating layer will be silicon dioxide. Where the process is being used in the form of an acoustic wave device, a deposited layer will be preferably required to have a narrow x ray diffraction peak half width on (002) to function as a piezo electric thin film. This deposited layer is preferably aluminium nitride. It is preferred that the aluminium nitride is deposited at a temperature below 500° C.

As is known in the art the FWHM rocking curve of a diffraction peak is a good indication of degree of orientation. This rocking curve is obtained by rotating a sample in an x-ray beam, which is directed at the surface being inspected. At a particular angle the curve produces a reflectance peak and by rocking the sample about that peak it is possible to determine the angle of rock needed to move the sample from half the maximum intensity on one side of the peak to the corresponding point on the other side of the peak. This angle is referred to as the FWHM measurement and the narrower the angle the better ordered the structure.

In an experiment aluminium nitride was deposited onto an underlayer of aluminium (that forms one electrode) in turn deposited upon a titanium adhesion layer upon an insulting layer of silicon dioxide. The silicon dioxide had been treated in one of three ways and the FWH rocking curve of the aluminium nitride measurement was obtained on (002).

The experimental results were as follows:

| Process characteristic | Standard | Method 1 | Method 2 |
|---|---|---|---|
| Mode | RF biased ICP | RF biased ICP | RIE |
| Power Inductive coil | 350 W | 350 W | — |
| Substrate platen power | 400 W | 110 W | 600 W |
| Platen temperature | 150° C. | 400° C. | 400° C. |
| Process gas | 30 sccm Ar | 50 sccm $H_2$ | 300 sccm $H_2$ |
| Process time | 32 seconds | 30 minutes | 10 minutes |
| FWHM rocking curve on (002) aluminium nitride peak | 5.5 | 2.4 | 2.2 |

All processes here are sputter etching;
'ICP' means Inductively Coupled Plasma and includes an RF power supply predominantly inductively coupled to a plasma and an RF power supply connected to the substrate platen.
'RIE' is used here in its industry standard use; meaning that process power is predominantly or exclusively applied to the substrate holder. Any 'reactive' element to the etching is insignificant in the experimental processes reported as silicon dioxide is insignificantly reactive with hydrogen. The predominant etch method is by sputtering and due to the low mass of the hydrogen ion the etching is slow.

The standard method is a very short argon etch which is generally used to clean the surface of a substrate prior to deposition.

The other two methods, which have been developed by the applicants, indicate the benefit of hydrogen pretreatment, with the FWHM measurement being reduced by over half or, put another way, with an over 100% improvement in orientation.

Although, as has been mentioned above, etching may be a part of what is happening to the surface, it is noted that the etch rate of silicon dioxide using hydrogen is considerably less than argon (~21 Å/min in 'RIE' mode, 6 Å/min in ICP mode compared with 450–650 Å/min in the 'standard' process").

In the light of this, it is considered more likely that hydrogen is implanted into the surface of the substrate improving the grain structure of that surface or it may be that the hydrogen in the surface creates favourable conditions for the grain orientation of the subsequently deposited layer. This process, whilst it enables the formation of bulk SAW devices is commercially viable in spite of its long process times. However, the applicants have also observed that an 80 mm titanium film which is sputtered onto a silicon wafer in a cryogenically pumped vacuum system that has stood idle for a long period of time (say 10 hours or more) gives a Ti<002>:<011> XRD ratio that is high. (>10:1). A vacuum would, in those conditions, have a high hydrogen content due to the well known inability of cryogenic pumps to pump hydrogen well.

Another aspect of the invention is therefore to treat the first or subsequent metallic layers of a multilayer structure with atomic hydrogen, typically in a plasma. This could most conveniently be done simultaneously with a metallic sputtering process e.g. titanium, titanium nitride, titanium oxide, tungsten, tungsten nitride, tantalum, tantalum nitride, aluminium, aluminium alloys, copper, aluminium nitride.

The sputtering process requires a plasma to generate the argon ions required for the process from the argon gas supplied to the vacuum process chamber. Hydrogen additions in controlled small quantities would be ionised by the electric fields present within the vacuum vessel (or could be previously ionised): Thus atomic hydrogen would be incorporated within at least the surface of the sputtered film causing its crystallographic structure to be preferentially modified.

This structural modification of at least the surface enables a higher proportion of a preferential crystal orientation in a subsequently deposited metal conductor. Thus a layer of a metallic barrier structure lying between an insulating layer and a conducting layer could be crystallographically modified by the use of this hydrogen treatment thus causing layers further deposited upon it to have a preferential structure. In addition or alternatively the layers requiring this preferential crystallography could be sputtered themselves in the presence of hydrogen or subsequently treated with atomic hydrogen. The preferential structure is characterised by having increased functional capabilities due to its more regularly ordered crystallography e.g. a reduced susceptibility to electromigration and is frequently characterised by having a higher proportion of <111> crystal orientation.

What is claimed is:

1. A method of depositing an aluminum nitride layer on an exposed surface of previously deposited insulating layer on a substrate, said method comprising:

treating the exposed surface with hydrogen or a gaseous source of hydrogen in the presence of a plasma; and depositing the aluminum nitride layer over the exposed surface, wherein the hydrogen treatment occurs prior to or during the deposition of the aluminum nitride layer, wherein the plasma is supplied by a Reactive Ion Etching process, and wherein the aluminum nitride layer is deposited as a piezoelectric layer of an acoustic wave device.

2. The method as claimed in claim 1 wherein the hydrogen treatment time is less than 15 minutes.

3. A method of depositing an aluminum nitride layer on an exposed surface of previously deposited insulating layer on a substrate, said method comprising:

treating the exposed surface with hydrogen or a gaseous source of hydrogen in the presence of a plasma; and depositing the aluminum nitride layer over the exposed surface, wherein the hydrogen treatment occurs prior to or during the deposition of the aluminum nitride layer, and wherein a duration and plasma power of the hydrogen treatment are sufficient to improve the crystal orientation of the deposited aluminum nitride layer such that the x-ray diffraction peak half width on a crystallographic plane of the deposited aluminum nitride layer is narrowed relative to the x-ray diffraction peak half width on the crystallographic plane of an aluminum nitride layer deposited in the absence of the hydrogen treatment.

4. The method as claimed in claim 3 wherein the plasma is an Inductively Coupled Plasma.

5. The method as claimed in claim 4 wherein the substrate is placed on an RF biased platen.

6. The method as claimed in claim 5 wherein the platen is heated.

7. The method as claimed in claim 3 wherein the aluminum nitride layer is deposited as a piezoelectric layer of an acoustic wave device.

8. The method of treating an aluminum nitride layer including subjecting the aluminum nitride layer to atomic hydrogen so as to enhance the <111> crystallographic orientation of a conductive layer deposited on the aluminum nitride layer relative to the <111> crystallographic orientation of a conductive layer deposited on an aluminum nitride layer which has not been subjected to atomic hydrogen.

9. The method as claimed in claim 8 wherein the aluminum nitride layer is deposited as a piezoelectric layer of an acoustic wave device.

10. The method as claimed in claim 8 further including simultaneously subjecting the aluminum nitride layer to hydrogen plasma and depositing the conductive layer by metallic sputtering.

\* \* \* \* \*